(12) United States Patent
Märgner et al.

(10) Patent No.: US 11,592,280 B2
(45) Date of Patent: Feb. 28, 2023

(54) METHOD FOR COMPENSATING FOR INTERFERENCE OF A MEASURED ANGLE SIGNAL OF A MAGNETIC ANGLE SENSOR OF AN ELECTRIC MACHINE, A CORRESPONDINGLY DESIGNED MICROCONTROLLER, AN ELECTRIC MACHINE, AND A COMPUTER PROGRAM PRODUCT

(71) Applicant: Vitesco Technologies GMBH, Hannover (DE)

(72) Inventors: Moritz Märgner, Berlin (DE); Aitor Cortabarria, Berlin (DE); Norbert Fröhlich, Kantstr. (DE)

(73) Assignee: VITESCO TECHNOLOGIES GMBH, Hannover (DE)

( * ) Notice: Subject to any disclaimer, the term of this patent is extended or adjusted under 35 U.S.C. 154(b) by 113 days.

(21) Appl. No.: 16/823,385

(22) Filed: Mar. 19, 2020

(65) Prior Publication Data
US 2020/0217640 A1 Jul. 9, 2020

Related U.S. Application Data

(63) Continuation of application No. PCT/EP2018/074143, filed on Sep. 7, 2018.

(30) Foreign Application Priority Data

Sep. 19, 2017 (DE) .................... 10 2017 216 536.7

(51) Int. Cl.
*G01B 7/30* (2006.01)
*G01D 5/14* (2006.01)
*G01R 33/02* (2006.01)

(52) U.S. Cl.
CPC ............... *G01B 7/30* (2013.01); *G01D 5/145* (2013.01); *G01R 33/02* (2013.01)

(58) Field of Classification Search
CPC .......... G01B 7/30; G01D 5/145; G01R 33/02
See application file for complete search history.

(56) References Cited

U.S. PATENT DOCUMENTS 6,020,737 A 2/2000 Wyss
6,326,781 B1* 12/2001 Kunde .................. G01D 5/145
324/144

(Continued)

FOREIGN PATENT DOCUMENTS

CN 103650326 A 3/2014
CN 105403233 A 3/2016

(Continued)

OTHER PUBLICATIONS

Chinese Office Action dated May 31, 2021 for corresponding Chinese Patent Application No. 201880054745.2.

(Continued)

*Primary Examiner* — Reena Aurora

(57) ABSTRACT

A method for compensating interference in a measured angle signal of a magnetic angle sensor of an electrical machine, wherein the method includes: receiving a measured angle signal, estimating a current error and/or a misalignment error in the measured angle signal, calculating an expected rotor angle from the measured angle signal, taking into account the estimated current error and/or the estimated misalignment error, such as during operation of the electrical machine. The present invention furthermore relates to a microcontroller for calculating interference in a measured angle signal of a magnetic angle sensor of an electrical (Continued)

machine, to an electrical machine having a magnetic angle sensor and a microcontroller and to a computer program product.

17 Claims, 8 Drawing Sheets

(56) References Cited

U.S. PATENT DOCUMENTS

| | | | |
|---|---|---|---|
| 6,496,784 B1* | 12/2002 | Dukart | G01D 1/16 |
| | | | 702/94 |
| 9,225,274 B2 | 12/2015 | Lingenfelser et al. | |
| 9,863,788 B2 | 1/2018 | Ausserlechner | |
| 10,816,318 B2* | 10/2020 | Vandersteegen | G01B 7/30 |
| 2006/0125439 A1 | 6/2006 | Ajima et al. | |
| 2013/0262009 A1* | 10/2013 | Oowada | G01D 5/2073 |
| | | | 702/94 |
| 2014/0125267 A1 | 5/2014 | Suzuki | |
| 2014/0288883 A1 | 9/2014 | Hammerschmidt et al. | |
| 2016/0109264 A1* | 4/2016 | Baumann | G01D 5/2448 |
| | | | 324/207.25 |
| 2016/0202296 A1 | 7/2016 | Costanzo et al. | |
| 2016/0304125 A1 | 10/2016 | Füßl et al. | |
| 2018/0080797 A1* | 3/2018 | Roos | G01D 5/24476 |
| 2020/0300671 A1* | 9/2020 | Mori | G01R 35/00 |

FOREIGN PATENT DOCUMENTS

| | | |
|---|---|---|
| CN | 105492871 A | 4/2016 |
| CN | 107078668 A | 8/2017 |
| DE | 102014210767 A1 | 12/2015 |
| DE | 102015115247 A1 | 3/2016 |
| DE | 102011076734 | 10/2016 |
| EP | 2154487 A2 | 2/2010 |
| WO | 0079220 A1 | 12/2000 |
| WO | 2006092026 A1 | 9/2006 |
| WO | 2016174506 A1 | 11/2016 |

OTHER PUBLICATIONS

International Search Report and Written Opinion dated Dec. 14, 2018 from corresponding International Patent Application No. PCT/EP2018/074143.

German Office Action dated Apr. 30, 2018 for corresponding German Patent Application No. 10 2017 216 536.7.

* cited by examiner

METHOD FOR COMPENSATING FOR INTERFERENCE OF A MEASURED ANGLE SIGNAL OF A MAGNETIC ANGLE SENSOR OF AN ELECTRIC MACHINE, A CORRESPONDINGLY DESIGNED MICROCONTROLLER, AN ELECTRIC MACHINE, AND A COMPUTER PROGRAM PRODUCT

CROSS-REFERENCE TO RELATED APPLICATIONS

This application claims priority to PCT Application PCT/EP2018/074143, filed Sep. 7, 2018, which claims priority to German Patent Application No. DE 10 2017 216 536.7, filed Sep. 19, 2017. The disclosures of the above applications are incorporated herein by reference.

FIELD OF THE INVENTION

The present invention relates to a method for compensating interference in a measured angle signal of a magnetic angle sensor of an electrical machine, to a microcontroller for calculating interference in a measured angle signal of a magnetic angle sensor of an electrical machine, and to a correspondingly designed electrical machine.

BACKGROUND OF THE INVENTION

Knowledge of the rotor angle position is necessary in order to drive an electrical machine. Inductive angle sensors or reluctance resolvers are often used for this purpose. However, inductive angle sensors and reluctance resolvers are cost-intensive.

Using magnetic angle sensors, on the other hand, is inexpensive and also accurate. A magnetic angle sensor includes what is known as an integrated cross-Hall element. This cross-Hall element generates an electrical characteristic variable in relation to the flow direction of an applied external magnetic field. By changing a magnetic field acting on the cross-Hall element, such as for example when a magnetic field of a permanent magnet rotates around the central axis of the sensor element, two 90°-phase-shifted sine and cosine curves are generated, on the basis of which the angle of rotation is able to be detected as an absolute value. Evaluation electronics integrated in the magnetic angle sensor convert these measured sine and cosine curve signals into a linear voltage or current signal. Using the absolute measurement principle, the correct angle of rotation is able to be output even following current interruptions. However, magnetic angle sensors are sensitive to interfering magnetic fields, which occur for example due to live conductors and/or due to permanent magnets in electrical machines. When using magnetic angle sensors in electrical machines, there is therefore a need for methods for compensating interfering magnetic fields.

SUMMARY OF THE INVENTION

One object of the present invention is therefore to provide a method for compensating interfering fields and to provide a correspondingly designed microcontroller and a correspondingly designed electrical machine by way of both of which the method for compensating interfering fields is able to be executed.

This object is achieved by a method for compensating interference in a measured angle signal of a magnetic angle sensor of an electrical machine and by a microcontroller for calculating interference in a measured angle signal of a magnetic angle sensor of an electrical machine. This object is furthermore achieved by an electrical machine having a magnetic angle sensor and such a microcontroller, and by a computer program product that is able to execute the method.

According to the present invention, what is therefore proposed is a method for compensating interference in a measured angle signal of a magnetic angle sensor of an electrical machine, wherein the method includes the following steps:

receiving a measured angle signal,
estimating a current error and/or a misalignment error in the measured angle signal,
calculating an expected rotor angle from the measured angle signal, taking into account the estimated current error and/or the estimated misalignment error, such as during operation of the electrical machine.

According to the proposal, a changing magnetic field is measured by way of a magnetic angle sensor. By rotating a rotor in an electrical machine, on which rotor a permanent magnet is arranged, a magnetic field that changes over time is for example able to be generated in the angle sensor, or a direction-dependent changing magnetization is able to be detected in the angle sensor. The magnetic angle sensor preferably has two Wheatstone bridges, which may be at an angle of 45° to one another, such that the angle sensor measures two voltage signals in accordance with equations (1) and (2):

$$U_{sin} = A \sin(2\alpha) \quad (1)$$

$$U_{cos} = A \cos(2\alpha) \quad (2).$$

An angle sensor utilizes what is known as the magnetoresistive effect, as occurs for example in the permalloy alloy. In the case of this effect, the resistance changes as a function of the direction of the changing induced magnetic field. The measured sensor signal may however contain a current error and/or a misalignment error due to current interference or due to an inexact arrangement of the permanent magnet at one rotor end. In the case of a current error, the measured phase currents themselves are not generally affected by errors. However, the magnetic field caused by the phase currents causes an error in the sensor, this being compensated by the proposed method. In general, the sensor signal may be subject to interference due to various errors, as a result of which the amplitudes $A_{sin}$, $A_{cos}$ of the two component sensor signals may be different, specifically:

$$U_{sin} = A_{sin} \cdot \sin(2\alpha)$$

$$U_{cos} = A_{cos} \cdot \cos(2\alpha).$$

Both signals may for example contain an offset error $O_{sin}$, $O_{cos}$:

$$U_{sin} = A_{sin} \cdot \sin(2\alpha) + O_{sin}$$

$$U_{cos} = A_{cos} \cdot \cos(2\alpha) + O_{cos}.$$

Furthermore, both signals may for example contain a misalignment error $\varepsilon$ if the sensor is not arranged in a manner centered on the rotor of the electrical machine:

$$U_{sin} = A_{sin} \cdot \sin(2\alpha + \varepsilon) + O_{sin}$$

$$U_{cos} = A_{cos} \cdot \cos(2\alpha + \varepsilon) + O_{cos}.$$

If electric currents flow in the rotor, the measured magnetic field, which is measured by the sensor, may also be subject to interference. The sensor signal, which contains all possible errors, is then given by:

$$U_{sin}=A_{sin}\cdot\sin(2\alpha_I+\varepsilon)+O_{sin}$$

$$U_{cos}=A_{cos}\cdot\cos(2\alpha_I+\varepsilon)+O_{cos}.$$

wherein $\alpha_I$ is an angle of the magnetic field that is subject to interference due to a phase current error. One aim of the present invention is to compensate all errors as far as possible.

According to the proposal, in addition to other errors, primarily the current error and/or the misalignment error are taken into account in the proposed method by estimating a magnitude of one or both of these errors and correcting the measured angle signal by such an error. After correcting the measured angle signal by such an error, an expected actual rotor angle may be calculated from the measured angle signal. Such calculation of the expected angle signal, taking into account the estimated current error and/or the estimated misalignment error, may be performed during operation of the electrical machine. Using the proposed method, which corresponds to the operation of a digital filter, it is therefore possible to determine an actual rotor angle position. Digital filters are used in control engineering to manipulate a signal. In contrast to analog filters, no electronic components are used for a digital filter, but rather logic modules are used. In addition, a digital filter processes time-discrete and value-discrete signals, such as for example those detected by a magnetic angle sensor. Using the proposed method, the error in the rotor angle position is in this case preferably less than or equal to 1° at a velocity of for example up to 18 000 rpm. Furthermore, an angular velocity of the rotor is able to be determined using the proposed method. Thus, for example during constant acceleration or braking of up to 30 000 rpm/s, the angular velocity error may be less than or equal to 10 rpm. The proposed method may advantageously be used to compensate a measurement error by up to 20%, such that an actual expected rotor angle is able to be determined using the proposed method. In addition to the mentioned current errors and/or misalignment errors, the measurement errors may also in this case be an offset error. The proposed method may be used for example to compensate a misalignment error that is caused by a radial misalignment of up to 1 mm and an axial misalignment of up to 5 mm of the permanent magnet on the rotor. Furthermore, a current error of up to 400 A may be compensated. The proposed method is additionally able to be performed quickly, which in one embodiment has a measurement time of 100 μs per measurement.

In order to estimate the current error and/or the misalignment error, the measured angle signal, which includes at least two components, is preferably delivered to a calculation program stored in a microcontroller.

The calculation program is software that is able to solve systems of equations, i.e. matrices. One aim of the described method is to estimate or to calculate the rotor position angle by evaluating the measured angle sensor signal. In the calculation program that is used, it is preferred not to make any assumptions about a mass, such as of an automobile or of a drivetrain of an automobile, or an influence of a current on the movement of the rotor. Instead, it is assumed that it is possible to assign the rotor an angular acceleration, an angular velocity and an angle, that is to say a state $$\begin{pmatrix} \ddot{\alpha} \\ \dot{\alpha} \\ \alpha \end{pmatrix},$$

which may be represented by the following system of equations:

$$\frac{d}{dt}\underbrace{\begin{pmatrix} \ddot{\alpha} \\ \dot{\alpha} \\ \alpha \end{pmatrix}}_{\xi} = \underbrace{\begin{bmatrix} 0 & 0 & 0 \\ 1 & 0 & 0 \\ 0 & 1 & 0 \end{bmatrix}}_{A} \cdot \underbrace{\begin{pmatrix} \ddot{\alpha} \\ \dot{\alpha} \\ \alpha \end{pmatrix}}_{\xi} + \underbrace{\begin{bmatrix} 1 \\ 0 \\ 0 \end{bmatrix}}_{B} \cdot \tau \quad (3)$$

$$\frac{d}{dt}\xi = A\cdot\xi + B\cdot\tau. \quad (4)$$

In this case, $\xi$ is the state of the system and A is the associated state matrix. The unknown change in angular acceleration is denoted by the variable $\tau$. For an observer, it is assumed that $\tau=0$. In order to obtain a structure of the observer, an estimated angle $\tilde{\alpha}$ has to be able to be assigned to a measured angle signal. A difference between an estimated angle $\tilde{\alpha}$ and a measured angle signal $\alpha$ may then be described by the following equations:

$$\theta \coloneqq 2\cdot\alpha$$

$$\tilde{\theta}=2\cdot\tilde{\alpha}$$

$$\sin(\theta-\tilde{\theta})=\sin(\theta)\cdot\cos(\tilde{\theta})-\cos(\theta)\cdot\sin(\tilde{\theta})$$

$$\sin(\theta-\tilde{\theta})\approx\theta-\tilde{\theta} \text{ for slight differences and so that:}$$

$$\theta-\tilde{\theta}\approx\sin(\theta)\cdot\cos(\tilde{\theta})-\cos(\theta)\cdot\sin(\tilde{\theta}).$$

The difference $\alpha-\tilde{\alpha}$ may be expressed by the difference $\theta-\tilde{\theta}$, such that the sensor signal system is given by $$\vartheta = \underbrace{[0 \ 0 \ 2]}_{C}\cdot\xi. \quad (5)$$

The system (A, C) is observable and is solved using the proposed method.

According to one preferred embodiment of the method, the calculation program includes a model by way of which a rotor state detected by way of the received angle signal and including an angle and an angular velocity and an angular acceleration is mapped onto a current actual rotor state taking into account various errors in the angle signal including an amplitude error and/or an offset error and/or the misalignment error and/or the current error.

Different errors may thus be taken into account in the proposed method, or the measured angle signal may be corrected on the basis of different errors. The correction preferably includes adding or subtracting an estimated value to or from a measured value. It may furthermore include multiplying or dividing or concatenating the basic arithmetic rules.

The use of a model in relation to the current error and/or the misalignment error is preferably applied. It has proven in the present case that taking into account a current error and/or a misalignment error in the model in order to calculate an expected rotor angle leads to correct values of the rotor angle.

In the present case, a misalignment error is defined as a radial misalignment and/or an axial misalignment of the permanent magnet with respect to an axial axis of the rotor of the electrical machine. Such a radial misalignment may for example be radially up to 2 mm. An axial misalignment may for example be up to 5 mm. Such radial and/or axial misalignment errors are able to be taken into account using the proposed method. A current error results from the usual uncertainties or brief current interruptions in an electrical system. A current error of up to 400 A is able to be taken into account using the proposed method.

The estimated current error and/or the estimated misalignment error is/are preferably used to estimate a rotor angle error by determining a difference from a measured rotor angle minus an estimated rotor angle.

The current error and/or the estimated misalignment error may be taken into account by subtracting an estimated rotor angle error from the measured rotor angle. It is thus assumed that the measured rotor angle turns out to be too great due to the simultaneously measured current error and/or the misalignment error. It is also conceivable for the values to be added instead of subtracted.

The estimation of a current error may be estimated for example using the following equation. Assuming that the errors in the components $x_I$ and $y_I$ are caused by the phase currents $I_1$, $I_2$, $I_3$ and simply add together, the components $x_I$ and $y_I$ may simply be written as:

$$x_I = p_{x1} \cdot I_1 + p_{x2} \cdot I_2 + p_{x3} \cdot I_3$$

$$y_I = p_{y1} \cdot I_1 + p_{y2} \cdot I_2 + p_{y3} \cdot I_3 \qquad (6)$$

The angle $\alpha_I$ is an angle between the point $$P_I = \begin{pmatrix} \cos(\alpha) + x_I \\ \sin(\alpha) + y_I \end{pmatrix}$$

and the x-axis:

$$\sin(\alpha_I) = \frac{\sin(\alpha) + y_I}{\sqrt{(\sin(\alpha) + y_I)^2 + (\cos(\alpha) + x_I)^2}}$$

$$\cos(\alpha_I) = \frac{\cos(\alpha) + \Delta x_I}{\sqrt{(\sin(\alpha) + y_I)^2 + (\cos(\alpha) + x_I)^2}}$$

Doubling the angle $\alpha_I$ may be written as $$\sin(2 \cdot \alpha_I) = \sin(\alpha_I + \alpha_I) =$$
$$\sin(\alpha_I) \cdot \cos(\alpha_I) + \cos(\alpha_I) \cdot \sin(\alpha_I) = 2 \cdot \frac{(\sin(\alpha) + y_I) \cdot (\cos(\alpha) + x_I)}{(\sin(\alpha) + y_I)^2 + (\cos(\alpha) + x_I)^2}$$

and $$\cos(2 \cdot \alpha_I) = \cos(\alpha_I + \alpha_I) =$$
$$\cos(\alpha_I) \cdot \cos(\alpha_I) - \sin(\alpha_I) \cdot \sin(\alpha_I) = \frac{(\cos(\alpha) + x_I)^2 - (\sin(\alpha) + y_I)^2}{(\sin(\alpha) + y_I)^2 + (\cos(\alpha) + x_I)^2}.$$

The influence of the errors $x_I$ and $y_I$ in relation to the measured sensor signals $U_{sin}$ and $U_{cos}$ may be put into the following relationship:

$$\Delta \sin(2\alpha_I) = \underbrace{\frac{d\sin(2\alpha_I)}{dx_I}}_{t_{sx}} \cdot \Delta x_I + \underbrace{\frac{d\sin(2\alpha_I)}{dy_I}}_{t_{sy}} \cdot \Delta y_I$$

$$\Delta \cos(2\alpha_I) = \underbrace{\frac{d\cos(2\alpha_I)}{dx_I}}_{t_{cx}} \cdot \Delta x_I + \underbrace{\frac{d\cos(2\alpha_I)}{dy_I}}_{t_{cy}} \cdot \Delta y_I$$

-continued $$\begin{pmatrix} \Delta \sin(2\alpha_I) \\ \Delta \cos(2\alpha_I) \end{pmatrix} = \underbrace{\begin{bmatrix} t_{sx} & t_{sy} \\ t_{cx} & t_{cy} \end{bmatrix}}_{T^T} \cdot \begin{pmatrix} \Delta x_I \\ \Delta y_I \end{pmatrix}$$

$$s := \sin(\alpha)$$

$$c := \cos(\alpha)$$

$$t_{sx} = 2 \cdot \frac{(s + y_I) \cdot (s + y_I - c - x_I) \cdot (s + y_I + c + x_I)}{((s + y_I)^2 + (c + x_I)^2)^2}$$

$$t_{sy} = -2 \cdot \frac{(c + x_I) \cdot (s + y_I - c - x_I) \cdot (s + y_I + c + x_I)}{((s + y_I)^2 + (c + x_I)^2)^2}$$

$$t_{cx} = 4 \cdot \frac{(c + x_I) \cdot (s + y_I)^2}{((s + y_I)^2 + (c + x_I)^2)^2}$$

$$t_{cy} = -4 \cdot \frac{(c + x_I)^2 \cdot (s + y_I)}{((s + y_I)^2 + (c + x_I)^2)^2}.$$

T is in this case a matrix for weighting the influence of the individual currents on the sensor signals.

The estimation of a misalignment error may be estimated for example using the following assumptions. A misalignment error is generated by a misalignment between the permanent magnet and the sensor. The sensor model taking into account only one misalignment error ε may therefore be written as:

$$\tilde{U}_{sin} = A \cdot \sin(2\alpha + \varepsilon)$$

$$\tilde{U}_{cos} = A \cdot \cos(2\alpha + \varepsilon)$$

The misalignment error may furthermore be modulated by:

$$\varepsilon = E_{s1} \sin(\alpha) + E_{s2} \sin(2\alpha) + E_{s4} \sin(4\alpha) + E_{sB} \sin(8\alpha) + E_{c1} \cos(\alpha) + E_{c2} \cos(2\alpha) + E_{c4} \cos(4\alpha) + E_{c8} \cos(8\alpha).$$

The actual rotor angle and/or the actual angular velocity and/or the actual angular acceleration is/are preferably derived from the estimated rotor angle error.

By taking into account an estimated rotor angle error, it is possible to correctly determine the rotor angle α, the angular velocity α' and the angular acceleration α". The proposed method in one embodiment includes taking into account implicit functions, that is to say implicit dependencies, such that correct values are able to be determined with regard to α, α' and α".

The estimated rotor angle error from an earlier method step or from the same method step is preferably used to calculate the expected rotor angle from the received angle signal, taking into account the estimated current error and/or the misalignment error.

The proposed method, which is executed during operation of the electrical machine, preferably includes at least one loop in which an already estimated rotor angle is used as a value, such as as a starting value, to continuously estimate the expected rotor angle. In the case of cyclical dependencies in the proposed method, which is preferably designed as an algorithm, the estimated rotor angle error from an earlier method step is used to calculate the expected rotor angle from the newly received angle signal. Resorting to estimated rotor angle errors from an earlier method step depends in one embodiment on the implementation and leads to a faster convergence of the proposed method.

An amplitude error and/or an offset error is/are preferably also taken into account, and in one embodiment is/are delivered to the calculation program, in order to calculate an expected rotor angle.

The estimation of an amplitude error and of an offset error may be estimated for example using the following assumption.

$$\tilde{U}_{sin} = \tilde{A}_{sin} \cdot \sin(2\alpha) + \tilde{O}_{sin}$$

$$\tilde{U}_{cos} = \tilde{A}_{cos} \cdot \cos(2\alpha) + \tilde{O}_{cos}$$

wherein ideal behavior of the sensor is assumed such that $$\tilde{A}_{sin} = A$$

$$\tilde{O}_{sin} = 0$$

$$\tilde{A}_{cos} = A$$

$$\tilde{O}_{cos} = 0.$$

A deviation in the parameters influences the difference between the estimated and the measured sensor signals as follows:

$$\Delta U_{sin} = U_{sin} - \tilde{U}_{sin}$$

$$\Delta U_{sin} = \underbrace{\frac{dU_{sin}}{dA_{sin}}}_{t_{sA}} \cdot \Delta A_{sin} + \underbrace{\frac{dU_{sin}}{dO_{sin}}}_{t_{sO}} \cdot \Delta O_{sin}$$

$$t_{sA} = \sin(2\alpha)$$

$$t_{sO} = 1$$

$$T_{sin} = \begin{bmatrix} \sin(2\alpha) \\ 1 \end{bmatrix}$$

and $$\Delta U_{cos} = U_{cos} - \tilde{U}_{cos}$$

$$\Delta U_{cos} = \frac{dU_{cos}}{dA_{cos}} \cdot \Delta A_{cos} + \frac{dU_{cos}}{dO_{cos}} \cdot \Delta O_{cos}$$

$$t_{cA} = \cos(2\alpha)$$

$$t_{cO} = 1$$

$$T_{cos} = \begin{bmatrix} \cos(2\alpha) \\ 1 \end{bmatrix}.$$

In order to determine the rotor angle error, at least one observer is preferably used, the observer reconstructing non-measurable variables from known input variables, such as interfering variables, and output variables, such as measured variables, of an observed system.

In control engineering, the term observer is to be understood to mean a system that determines non-measurable variables from known input variables, such as for example manipulated variables or measurable interfering variables, and output variables, such as for example measured variables such as the angle sensor signal, of an observed reference system. In this case, the observer simulates the observed reference system as a model and uses a controller to track the measurable measured variables that are therefore comparable with the reference system. It is thereby possible to avoid a situation in which a model, such as in reference systems with integrating behavior, generates an error that grows over time. An observer may in one embodiment be structured or set up when the reference system is observable using the available measured variables. Determining observability based on criteria is therefore a necessary prerequisite for using an observer. Observers are used in measurement engineering as a replacement for technically impossible measurements, such as for example in electrical machines.

A Luenberger observer or a Kalman filter is in one embodiment used as observer.

The Kalman filter is a closely related alternative to the Luenberger observer. The Luenberger observer constantly amplifies the error, that is to say the difference between the estimated and measured sensor values. The theory behind a Luenberger observer is based on connecting the observer in parallel with a controlled system model. In this case, the difference between the measured sensor value of the loop, that is to say the received measured angle value $\alpha$, and a "measured value" of the observer, that is to say an estimated value of the angle $\hat{\alpha}$, is fed back to the model. This allows the observer to respond to interference or its own inaccuracies. One advantage of the Luenberger observer is that the Luenberger observer is able to respond to its own inaccuracies. The Kalman filter calculates a new gain in each step based on assumptions about the noise from the sensors. This calculation also includes a matrix inversion. The Kalman filter therefore requires more knowledge about the system, such as the noise levels, and tends to require more computational power for the matrix inversion. The advantage of using the Kalman filter may be that the estimated value converges faster to the true value.

In order to estimate the current error, an error from each of three current phases of the electrical machine is preferably taken into account.

Furthermore, in one embodiment of the proposed method, it is assumed that the errors from the three current phases add together to give one error. A current error is thereby able to be delivered to the observer that is used.

In order to estimate the misalignment error, a difference is preferably calculated from the received angle signals affected by current errors.

Such calculation may be performed using the equations already described herein.

According to a further aspect of the present invention, what is proposed is a microcontroller for calculating interference in a measured angle signal of a magnetic angle sensor of an electrical machine, wherein the microcontroller is designed to receive the measured angle signal and to execute a method as described herein.

According to a further aspect of the present invention, what is proposed is an electrical machine having a magnetic angle sensor and having a microcontroller described herein, wherein the electrical machine has a rotor and a magnet arranged on the rotor.

In this case, the magnet arranged on the rotor induces a measurable magnetic field in the angle sensor through the movement of the rotor. The angle sensor preferably contains a permalloy alloy or the like, in which in any case a resistance is able to be measured as a function of a changing induced magnetic field. A permanent magnet is furthermore arranged on the rotor, which permanent magnet induces the magnetic field in the angle sensor when the rotor moves.

According to a further aspect of the present invention, what is proposed is a computer program product that, when it is executed on a processor, prompts the processor to execute a method described herein.

The invention described herein may be used primarily in electrical machines of all types in which the position of the rotor is measured taking into account generated magnetic fields. As described herein, the angle processing and the compensation of typical errors such as offset errors and/or amplitude errors in the sine and cosine signals, as well as misalignments between the sensor and the magnet and the compensation of the interfering fields caused by the currents, are performed by observers, such as by a Luenberger observer or by a Kalman Filter.

What is also advantageous in the embodiments of the method described herein is that the method or the various embodiments of the method do not require any parameterization effort. There is furthermore no need for any magnetic shielding, which is generally expensive. The described method is thus simpler and less expensive. The proposed method is self-learning, that is to say, in the course of the application of the method, increasingly correct error values of the various types are estimated increasingly quickly using the method.

Further advantages and features of the present invention become apparent from the following description of preferred embodiments with reference to the attached Figures. It is understood that individual embodiments shown in the respective Figures may have features that may also be used in other embodiments, even if this is not explicitly mentioned, provided that this has not been ruled out on the basis of technical circumstances or explicitly.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features and objects of the present invention will become apparent to a person skilled in the art by putting the present teaching into practice and taking into consideration the accompanying drawings, in which.

DETAILED DESCRIPTION OF THE PREFERRED EMBODIMENTS

The following description of the preferred embodiment(s) is merely exemplary in nature and is in no way intended to limit the invention, its application, or uses.

Further advantages of popular embodiments are explained in a summary of the following FIGS. 1 to 11.

Figure 1:
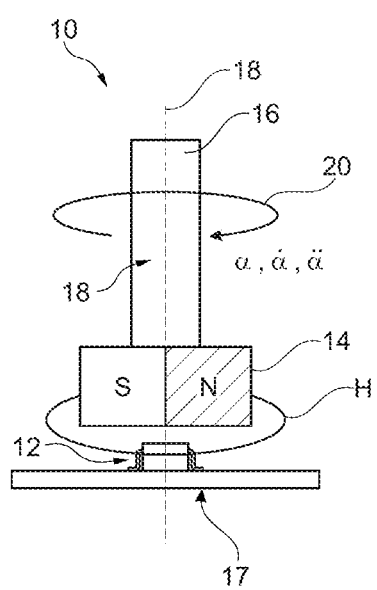
FIG. 1 shows an arrangement of a sensor and of a permanent magnet on a rotor of an electrical machine.

FIG. 1 shows an arrangement of a magnetic angle sensor 12 and of a permanent magnet 14 that is arranged on a rotor 16 of an electrical machine 10. As illustrated in FIG. 1, the sensor 12 is arranged on a substrate 17 opposite the permanent magnet 14. The substrate 17 is preferably designed as a PCB board or as a ceramic plate. The sensor 12 is arranged opposite the permanent magnet 14 along an axial axis 18 that runs along an extent of the rotor 16. A position of the rotor 16 on which the permanent magnet 14 is arranged is able to be measured by way of the magnetic angle sensor 12. The magnetic angle sensor 12 may for example include a permalloy alloy in which the resistance changes with the direction of the magnetic field. A movement 20 of the rotor 16 is indicated for example in FIG. 1 by the arrow 20. The movement 20 of the rotor 16 may therefore be detected by the angle sensor 12. The angle sensor 12 detects for example the rotor position angle $\alpha$, the rotor angular velocity $\alpha'$ and/or the rotor angular acceleration $\alpha''$.

Figure 2:
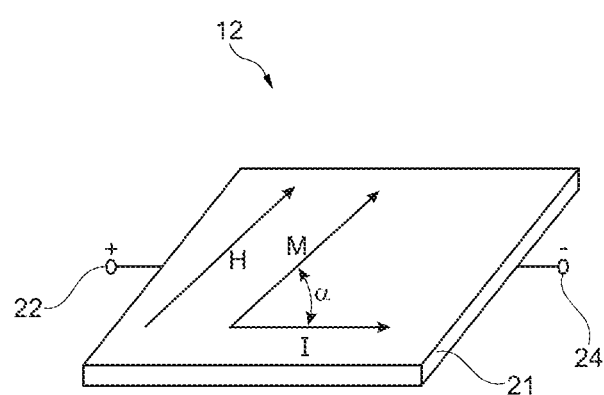
FIG. 2 shows a schematic depiction of the magnetoresistive effect in permalloy.

The magnetic angle sensor 12 preferably contains an alloy in which the measurable resistance in the form of a magnetization M changes as a function of a direction of a magnetic field H. This effect is known as the magnetoresistive effect. Such an alloy may be for example a permalloy alloy. A permalloy alloy preferably contains up to 80% by weight of nickel and up to 20% by weight of iron. FIG. 2 shows a schematic depiction of the magnetoresistive effect. In this case, I indicates a current that is able to be measured in the alloy 20 and that is able to be measured between a voltage difference 22, 24. It is furthermore conceivable for an alloy other than permalloy to be used, as long as the alloy that is used has the magnetoresistive effect.

Figure 3:
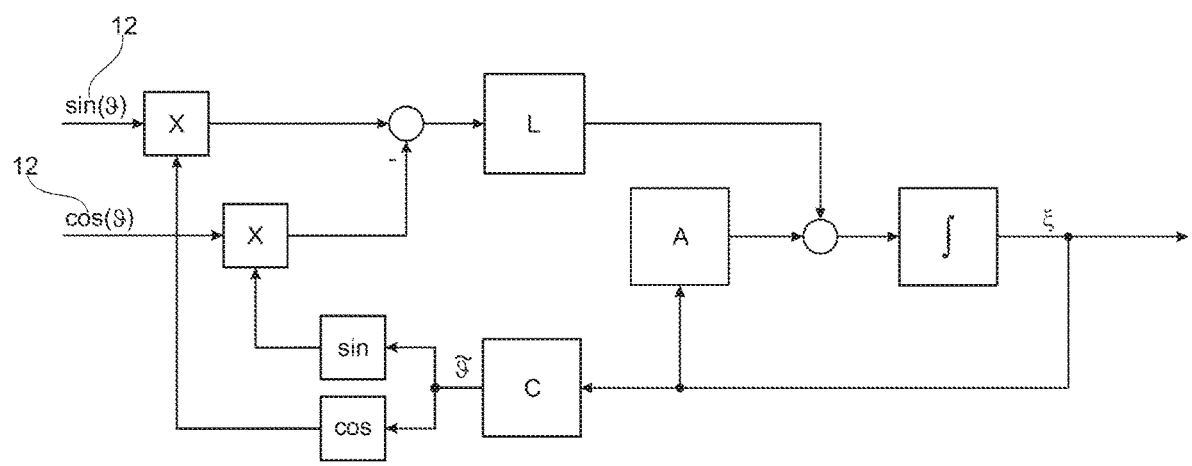
FIG. 3 shows a schematic depiction of the structure of an observer.

FIG. 3 shows a schematic depiction of the structure of an observer. The sensor 12 detects the values (sin($\theta$), cos($\theta$)) and delivers them to a calculation model. A is the system matrix and C is the output matrix of the system (A, C). The variables A and C may be used to determine whether the system is observable. The system is observable when for example the Kalman criterion or another criterion is met. If this is the case, a state $\tilde{\xi}$ of the system may thus be determined, wherein the estimation error $\theta - \tilde{\theta}$ is amplified by the matrix L in order to correct the estimated value for the state $\tilde{\xi}$ of the system. If the matrix (A-LC) contains only eigenvalues with a negative real part, the observer is stable. The system of equations is then solved by integration, as a result of which the system state $\tilde{\xi}$ is determined.

Figure 4:
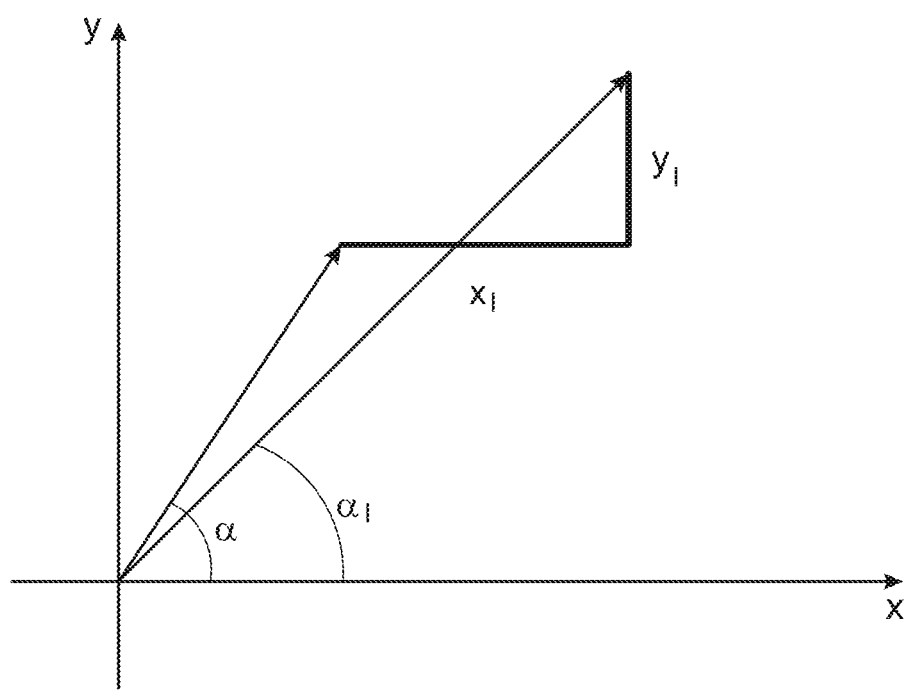
FIG. 4 shows a schematic depiction of a typical current error.

FIG. 4 shows a schematic depiction of a typical current error X in vector form. A current I measured by the angle sensor 12 includes the current error components $X=(x_I, y_I)$, which lead to the measured angle $\alpha_I$. The measured phases of the current itself are generally not affected by errors. However, the magnetic field caused by the phase currents causes an error in the sensor. The measured angle $\alpha_I$ therefore does not correspond to the actual angle $\alpha$, and so the measured angle $\alpha_I$ must be corrected accordingly by subtraction.

Figure 5:
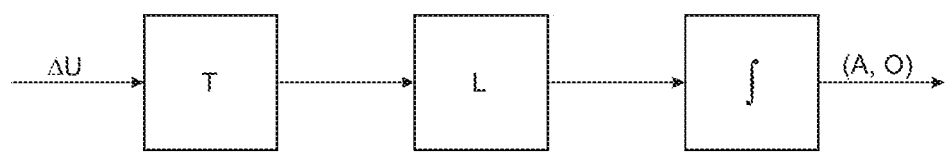
FIG. 5 shows a diagram of an offset and amplitude observer.

FIG. 5 shows a diagram of an offset observer and/or amplitude observer. The variable $\Delta U$ is in this case the difference between the measured sensor value (sin($\theta$), cos($\theta$)) and the estimate. The variable L is a freely selectable error gain. T is the weighting of the error, which is given by a partial derivation of the sensor signal according to the error sources amplitude and offset. The estimated values for amplitude and offset are adapted by integrating the sensor error—weighted with L and T.

The influence of the offset error is generally the same, whereas the influence of the amplitude error changes with the angle $\alpha$. A distinction is thereby able to be drawn between the error that contains the offset and the error that contains the amplitude error.

Figure 6:
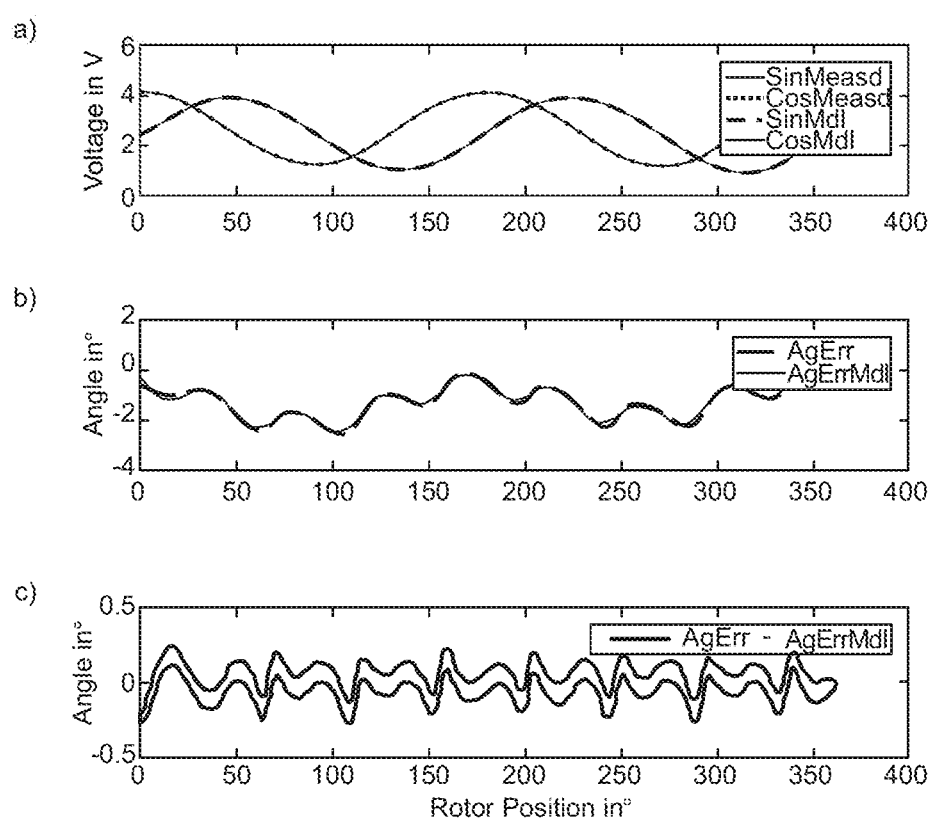
FIG. 6 shows measurement results of the misalignment error using an embodiment of the proposed method.

FIG. 6 shows measurement results of the misalignment error in relation to the rotor angle position using one embodiment of the proposed method. FIG. 6a shows measured sensor signals that were measured by the sensor 12, and ideal cosine and sine curves without a model for the offset error for comparison. FIG. 6b shows a resulting angle error AgErr, which results from the misalignment error, superimposed on a modeled angle error AgErrMdl. FIG. 6c shows the difference from the angle error AgErr minus the modeled angle error AgErrMdl. FIG. 6c shows a constant value that fluctuates in terms of absolute value by less than 1°.

Figure 7:
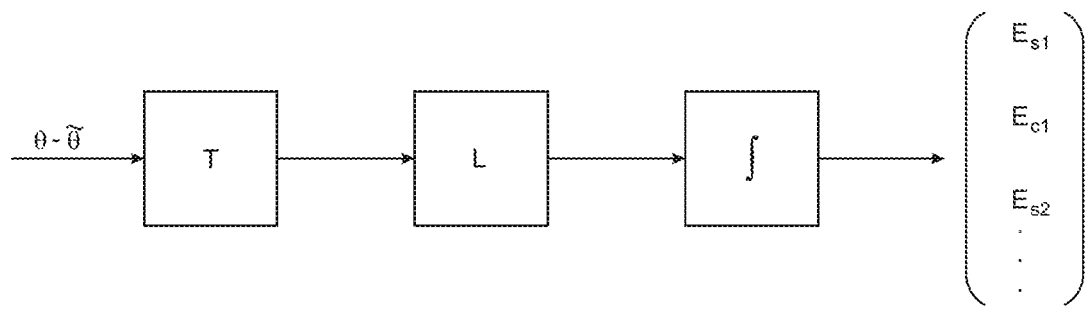
FIG. 7 shows a diagram of a misalignment error observer.

FIG. 7 shows a diagram of a misalignment observer, wherein the misalignment error is estimated as a difference between the measured angle and the estimated angle. Otherwise, the calculation runs in parallel with the calculation described with regard to FIG. 5, to which reference is hereby made.

Figure 8:
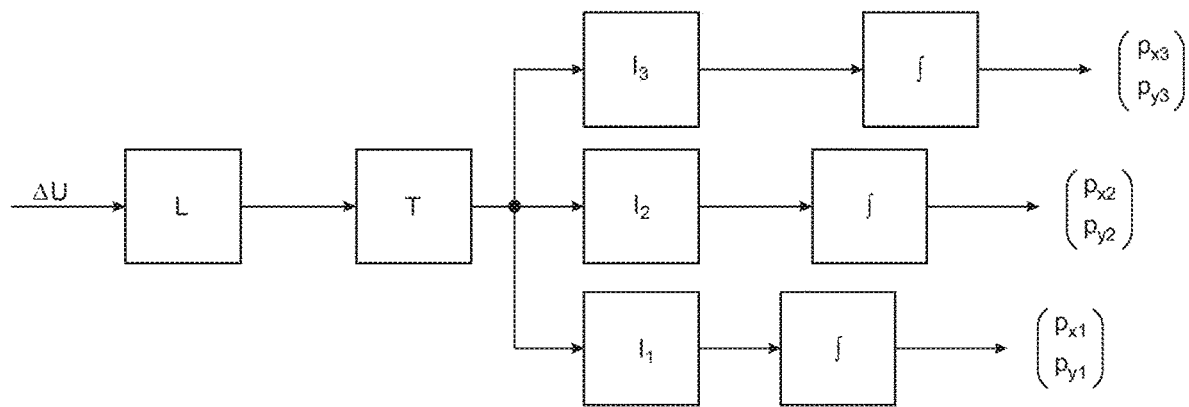
FIG. 8 shows a diagram of a current error observer.

In contrast to FIGS. 5 and 7, FIG. 8 shows a diagram of a current error observer. This furthermore differs in that an error is assigned to each phase $I_2$, $I_2$, $I_3$ of the current I, such that the current error components $x_I$ and $y_I$ may be written as a sum, as described herein. The parameters of the matrix T are freely selectable and include gain factors $$L = \begin{bmatrix} l_1 \\ l_2 \\ l_3 \end{bmatrix}.$$

Using the detected current of each phase, the parameters $p_{xn}, p_{yn}$, n=1, 2, 3 are able to be adapted accordingly, as is illustrated schematically in FIG. 8.

Figure 9:
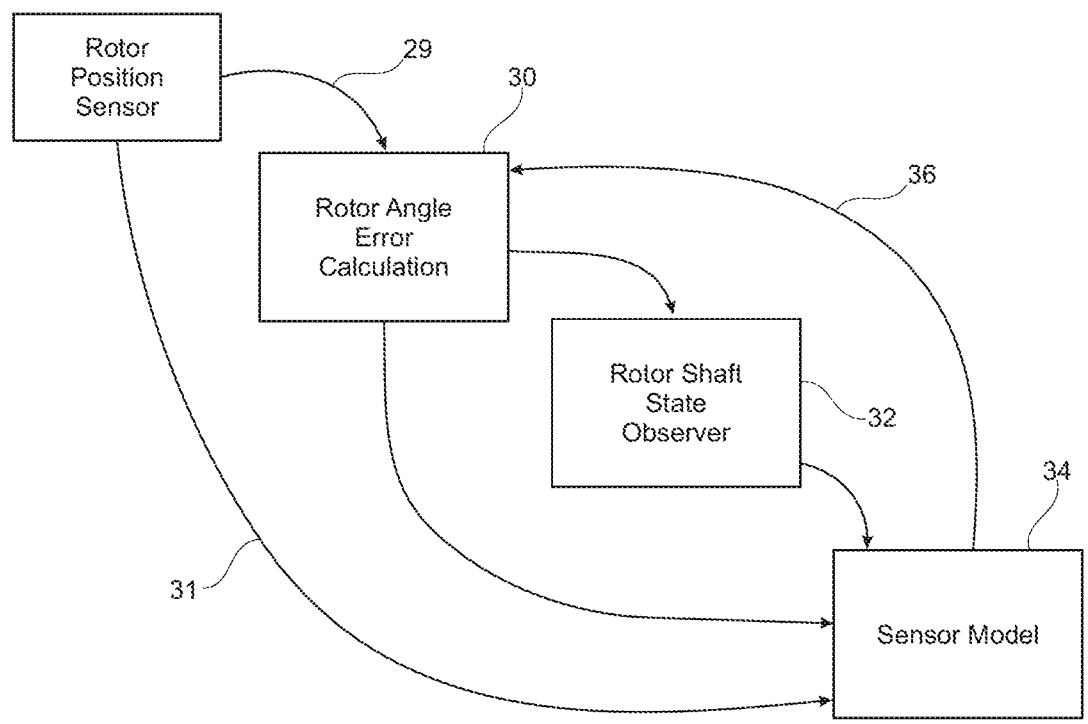
FIG. 9 shows a schematic depiction of the structure of the proposed method according to one preferred embodiment.

FIG. 9 shows a schematic depiction of the structure of the proposed method according to one preferred embodiment. In this method of FIG. 9, inter alia, the interference in a measured angle signal of a magnetic angle sensor of an electrical machine is compensated. Wherein the method includes the following steps: receiving a measured angle signal, estimating a current error and/or a misalignment error in the measured angle signal, and calculating an expected rotor angle from the measured angle signal, taking into account the estimated current error and/or the estimated misalignment error, such as during operation of the electrical machine.

FIG. 9 shows an overview of the signal flow of the proposed method. The idea of the method or of the algorithm is to determine non-measurable variables by comparing expected sensor signals (sine signals, cosine signals) with actually measured sensor signals. This takes place in step 30 'Rotor Angle Error Calculation'. Before this, however, sensor signals measured by the angle sensor 12 in step 29 are delivered to the described algorithm. The estimation for the rotor state (angle, angular velocity, angular acceleration) is improved by way of the angle error. This takes place in step 32 'Rotor Shaft State Observer'. The expected sensor values may be calculated from the estimated rotor angle with ideal values for the amplitude and the offset of the sensor. This takes place in step 34 'Sensor Model'. If the sensor behavior deviates from the ideal, this affects the estimation of the rotor state. In a step 36, of a loop 36, the calculated sensor values may again be delivered to the calculation method for compensating interfering fields until no or only a slight deviation from the ideal is able to be established. At the same time, the detected sensor signals are delivered directly to the sensor model 34 in a step 31, such that the sensor model is able to determine the parameters for the sensor model from the measured and the estimated values.

Figure 10:
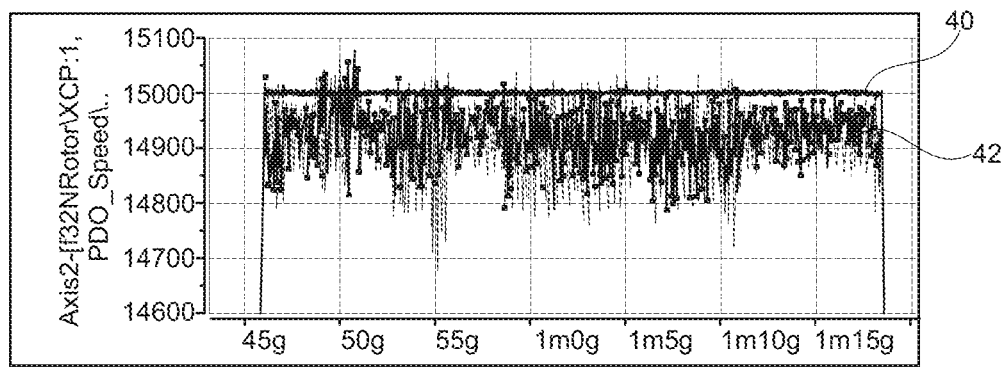
FIG. 10 shows measurement results that were obtained using a method known from the prior art.

FIG. 10 shows model results that were obtained using a method known from the prior art. The estimation according to the method known from the prior art leads to greatly scattered values between 14 800 and 15 100 rpm, that is to say to values that scatter over a range of 300 rpm.

Figure 11:
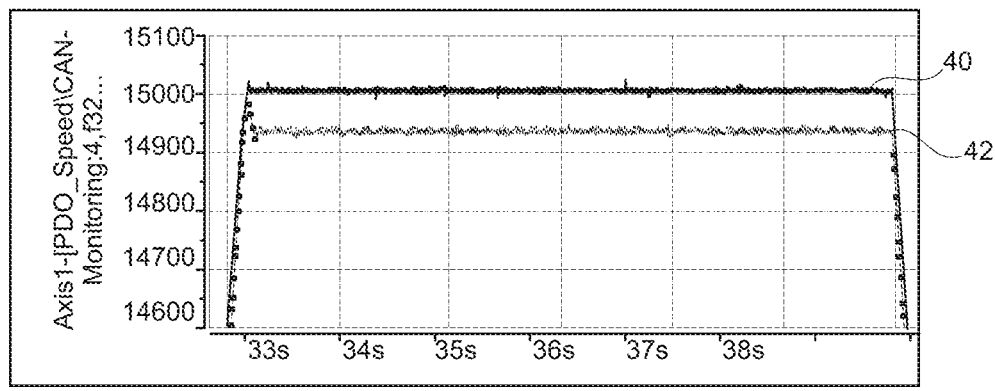
FIG. 11 shows measurement results that were obtained using the proposed method according to one preferred embodiment.

FIG. 11, on the other hand, shows model results that were obtained using the proposed method according to one preferred embodiment. Using the proposed method, values that constantly scatter in a small range of up to 20 rpm are achieved.

The curves 40 in FIGS. 10 and 11 each show measured curves or results, and the curves 42 each show calculated curves.

The description of the invention is merely exemplary in nature and, thus, variations that do not depart from the gist of the invention are intended to be within the scope of the invention. Such variations are not to be regarded as a departure from the spirit and scope of the invention.

LIST OF REFERENCE SIGNS 10 electrical machine
12 magnetic angle sensor
14 permanent magnet
16 rotor
17 substrate
18 rotor axis
20 movement of the rotor
21 alloy
22, 24 potential difference
I current
H magnetic field
M magnetization
α rotor angle
α' angular velocity
α" angular acceleration
29 step
30 rotor angle error calculation step
32 rotor state observer step
34 sensor model
36 loop
40 measured curve
42 calculated curve

What is claimed is:

1. A method for compensating interference in a measured angle signal of a magnetic angle sensor of an electrical machine, comprising the steps of:
providing a measured angle signal;
providing a current error being part of the measured angle signal;
providing a misalignment error being part of the measured angle signal; and
providing an expected rotor angle;
providing a measured rotor angle detected by the magnetic angle sensor;
providing an estimated rotor angle from an amplitude and an offset of the magnetic angle sensor;
receiving the measured angle signal;
estimating at least one of the current error or the misalignment error in the measured angle signal by determining a difference from the measured rotor angle minus the estimated rotor angle;
calculating the expected rotor angle from the measured angle signal, taking into account at least one of the estimated current error or the estimated misalignment error during operation of the electrical machine.

2. The method as claimed in claim 1, further comprising the steps of:
provicing a microcontroller;
providing a calculation program stored in the microcontroller; and
delivering the measured angle signal to the calculation program to estimate the current error and/or the misalignment error.

3. The method as claimed in claim 2, further comprising the steps of:
providing the measured angle signal to further comprise at least one error;
providing the calculation program to further comprise a model; and
providing at least one rotor state;
detecting the at least one rotor state by way of the received measured angle signal;
mapping at least one of an angle, or an angular velocity, or an angular acceleration onto the current actual rotor state taking into account the at least one error in the measured angle signal.

4. The method of claim 3, further comprising the steps of providing the at least one error to further comprise at least one of an amplitude error, an offset error, the misalignment error, or the current error.

5. The method of claim 2, further comprising the steps of:
providing an amplitude error; and
providing an offset error;
delivering at least one of the amplitude error or the offset error to the calculation program to calculate the expected rotor angle.

6. The method of claim 5, further comprising the steps of:
providing at least one observer;
providing an observed system; and
providing at least one interfering variable;
determining the rotor angle error using the at least one observer to reconstruct non-measurable variables from at least one input variable of the observed system and at least one output variable of the observed system.

7. The method of claim 6, further comprising the steps of providing the at least one input variable to further comprise at least one interfering variable.

8. The method of claim 6, further comprising the steps of providing the at least one output variable to further comprise at least one measured variable.

9. The method of claim 6, further comprising the steps of providing the at least one observer to be a Luenberger observer or a Kalman filter.

10. The method of claims 1, further comprising the steps of:
providing a rotor angle error;
using at least one of the estimated current error or the estimated misalignment error to estimate the rotor angle error by determining a difference from the measured rotor angle minus the estimated rotor angle.

11. The method of claim 10, further comprising the steps of deriving at least one of the actual rotor angle, or the actual angular velocity, or the actual angular acceleration from the estimated rotor angle error.

12. The method of claim 10, further comprising the steps of using the rotor angle error to calculate the expected rotor angle from the received measured angle signal taking into account at least one of the current error or the misalignment error.

13. The method of claim 1, further comprising the steps of:
providing three current phases being part of the electrical machine;
providing a plurality of errors, each of the plurality of errors corresponding to one of the three current phases;
taking into account the plurality of errors when estimating the current error.

14. The method of one of claim 13, further comprising the steps of adding the plurality of errors together to result in one error.

15. The method claim 1, further comprising the steps of calculating the difference from the received measured angle signal affected by current errors to estimate the misalignment error.

16. The method claim 1, further comprising the steps of:
providing a microcontroller for receiving the measured angle signal;
calculating interference in the measured angle signal of the magnetic angle sensor of the electrical machine using the microcontroller.

17. The method of claim 16, further comprising the steps of:
providing a rotor being part of the electrical machine; and
providing a permanent magnet arranged on the rotor such that the permanent magnet induces a measureable magnetic field in the angle sensor through a movement of the rotor.

* * * * *